(12) United States Patent
Han et al.

(10) Patent No.: US 7,218,806 B2
(45) Date of Patent: May 15, 2007

(54) MULTI-WAVELENGTH OPTICAL TRANSCEIVER MODULE, AND MULTIPLEXER/DEMULTIPLEXER USING THIN FILM FILTER

(75) Inventors: Young Tak Han, Daejeon (KR); Yoon Jung Park, Seoul (KR); Sang Ho Park, Daejeon (KR); Jang Uk Shin, Daejeon (KR); Duk Jun Kim, Daejeon (KR); Hee Kyung Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 35 days.

(21) Appl. No.: 11/188,681

(22) Filed: Jul. 25, 2005

(65) Prior Publication Data

US 2006/0088246 A1    Apr. 27, 2006

(30) Foreign Application Priority Data

Oct. 27, 2004    (KR) ............. 10-2004-0086390

(51) Int. Cl.
G02B 6/28 (2006.01)
G02B 6/12 (2006.01)
G02B 6/26 (2006.01)

(52) U.S. Cl. ................ 385/24; 385/14; 385/47; 385/48

(58) Field of Classification Search ............ 385/14, 385/24, 47, 48; 398/82, 85
See application file for complete search history.

(56) References Cited

U.S. PATENT DOCUMENTS

| | | | |
|---|---|---|---|
| 4,842,357 A | 6/1989 | Doneen | 385/12 |
| 6,760,510 B2 | 7/2004 | Kimura | 385/24 |
| 6,769,816 B2 | 8/2004 | Capewell et al. | 385/89 |
| 7,010,190 B2 * | 3/2006 | Chiu et al. | 385/24 |
| 2002/0048431 A1 | 4/2002 | Kimura | 385/47 |
| 2002/0197008 A1 * | 12/2002 | Kim et al. | 385/24 |

FOREIGN PATENT DOCUMENTS

| | | |
|---|---|---|
| EP | 1369719 | 12/2003 |
| JP | 62 98306 | 5/1987 |
| JP | 10 82925 | 3/1998 |
| JP | 2001 249247 | 9/2001 |
| JP | 2003 66255 | 3/2003 |
| KR | 97 11927 | 3/1997 |
| KR | 2002 0020577 | 3/2002 |

OTHER PUBLICATIONS

"A 1.3/1.55-μm Wavelength-Division Multiplexing Optical Module Using a Planar Lightwave Circuit for Full Duplex Operation" Hashimoto et al., Journal of Lightwave Technology, vol. 18, No. 11, Nov. 2000 pp. 1541-1547.

* cited by examiner

Primary Examiner—Quyen Leung
(74) Attorney, Agent, or Firm—Ladas & Parry LLP (57) ABSTRACT

Provided are a multi-wavelength optical transceiver module and a multiplexer/demultiplexer using a thin film filter. The multi-wavelength optical transceiver module includes: a PLC platform, on which a predetermined optical waveguide unit is formed and an optical transmitter is mounted; an optical fiber coupled to one side of the PLC platform to transmit a predetermined light; a plurality of thin film filters coupled to another side of the PLC platform to separate input optical wavelengths; and an optical receiver coupled to one side of the thin film filters to receive light that is input from the optical fiber and transmits the thin film filters, thereby enabling mass production of the optical transceiver module with low cost.

27 Claims, 5 Drawing Sheets

MULTI-WAVELENGTH OPTICAL TRANSCEIVER MODULE, AND MULTIPLEXER/DEMULTIPLEXER USING THIN FILM FILTER

CROSS-REFERENCE TO RELATED APPLICATION

This application claims priority to and the benefit of Korean Patent Application No. 2004-86390, filed Oct. 27, 2004, the disclosure of which is incorporated herein by reference in its entirety

BACKGROUND

1. Field of the Invention

The present invention relates to a multi-wavelength optical transceiver module, and multiplexer/demultiplexer using a thin film filter, and more specifically, to a multi-wavelength optical transceiver module, and multiplexer/demultiplexer using a thin film filter capable of producing an optical module at low cost in large quantities by hybrid-integrating a thin film filter, an optical transmitter, an optical receiver, and an optical fiber into a PLC platform.

2. Discussion of Related Art

In general, with an expansion of an optical communication system largely used in a backbone network into a subscriber network, various types of optical modules required in arranging the subscriber network are in high demand.

Particularly, for an optical transceiver module arranged in the subscriber side, such as a bi-directional optical transceiver module or an optical triplexer transceiver module and an optical quadraplexer transmitter and receiver module, low cost and mass production are key factors to determine the competitiveness.

Therefore, an optical integrated module technology has been developed that optical devices such as a thin film filter, a laser diode (LD), and a photodiode (PD) are hybrid-integrated on a PLC platform at the same time to manufacture the optical module in high performance at low cost.

In a conventional hybrid optical integrated module technology, one method of manufacturing an optical triplexer transceiver module is to form grooves of about 30 μm at two places in a silica planar lightwave circuit (hereinafter, referred to as 'PLC') and insert a thin film filter to thus implement a wavelength multiplexing device that separates wavelengths of 13910/1490/1550 nm, and mount active devices such as laser diodes (LD) and photodiodes (PD) onto a silica platform through precise flip-chip bonding.

However, the prior art described above has a problem in that a loss of reflected light significantly varies according to how much the thin film filter is inserted. In other words, the grooves into which the thin film filter is inserted are difficult to be uniformly formed at the exact place in a longitudinal direction with a narrow width, and when the thin film filter is inserted into the grooves and fixed with an index-matching epoxy, a tilt occurs so that light is not exactly incident on a reflection (caused by thin film filter) optical waveguide relative to an input optical waveguide.

Therefore, it is difficult to reduce an optical loss reflected at the thin film filter to about 1 dB, which is a factor that degrades the yield upon mass production, so that it is disadvantageous in terms of the low cost.

In addition, upon mounting the active devices such as the laser diode (LD) or the photodiode (PD) in the prior art, an expensive flip chip bonding apparatus should be used to ensure alignment accuracy to be within several μm, and forming a V-groove directly in the PLC to pigtail a predetermined optical fiber is an extremely difficult process, which is not appropriate for mass production.

In addition, since a waveguide photodiode (PD) is used in the prior art, there is a difficulty in demand and supply of the photodiode (PD) having good characteristics upon commercialization. Further, since the waveguide photodiode (PD) does not have good characteristics with respect to responsivity and inter-modulation distortion (IMD) relative to the commercialized pin-PD, there is a problem in arranging a receive unit, which is burdensome while packaging.

Therefore, in order to achieve the mass production and commercialization, there is a need for a method of easily fixing the thin film filter to the PLC, easily implementing performance of an optical transceiver module with a good-characteristic and commercialized pin-PD, and aligning and pig-tailing an optical fiber in a manner not to degrade the overall manufacturing yield.

SUMMARY OF THE INVENTION

The present invention is directed to a multi-wavelength optical transceiver module, and a method of manufacturing the multi-wavelength optical transceiver module using a thin film filter capable of producing an optical transceiver module at low cost in a large amount by hybrid-integrating a thin film filter, an optical transmitter, an optical receiver, and an optical fiber into a PLC platform.

One aspect of the present invention is to provide a multi-wavelength optical transceiver module using a thin film filter, comprising: a PLC platform on which a predetermined optical waveguide unit is formed and an optical transmitter are mounted; an optical fiber coupled to one side of the PLC platform to transmit a predetermined light; a plurality of thin film filters coupled to another side of the PLC platform to separate input optical wavelengths; and an optical receiver coupled to one side of each of the thin film filters to receive light that is input from the optical fiber and transmits the thin film filters.

Another aspect of the present invention is to provide a multi-wavelength optical receiver module using a thin film filter comprising: a PLC platform having a predetermined optical waveguide unit formed thereon; an optical fiber coupled to one side of the PLC platform to transmit a predetermined light; a plurality of thin film filters coupled to another side of the PLC platform to separate input light wavelengths; and an optical receiver coupled to one side of the thin film filters to receive light that transmits the thin film filters.

Yet another aspect of the present invention is to provide a multi-wavelength optical transmitter module comprising: a PLC platform, on which a predetermined optical waveguide unit is formed and a plurality of optical transmitters are mounted; an optical fiber coupled to one side of the PLC platform to transmit a predetermined light; and a plurality of thin film filters coupled to another side of the PLC platform to separate input optical wavelengths.

Still another aspect of the present invention is to provide a multi-wavelength multiplexer/demultiplexer using a thin film filter, comprising: a PLC having a predetermined optical waveguide unit formed thereon; an optical fiber block coupled to one side of the PLC to transmit light with a predetermined optical fiber fixed; and a plurality of thin film filters coupled to another side of the PLC to separate input light wavelengths.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

The present invention will now be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

First Embodiment

Figure 1:
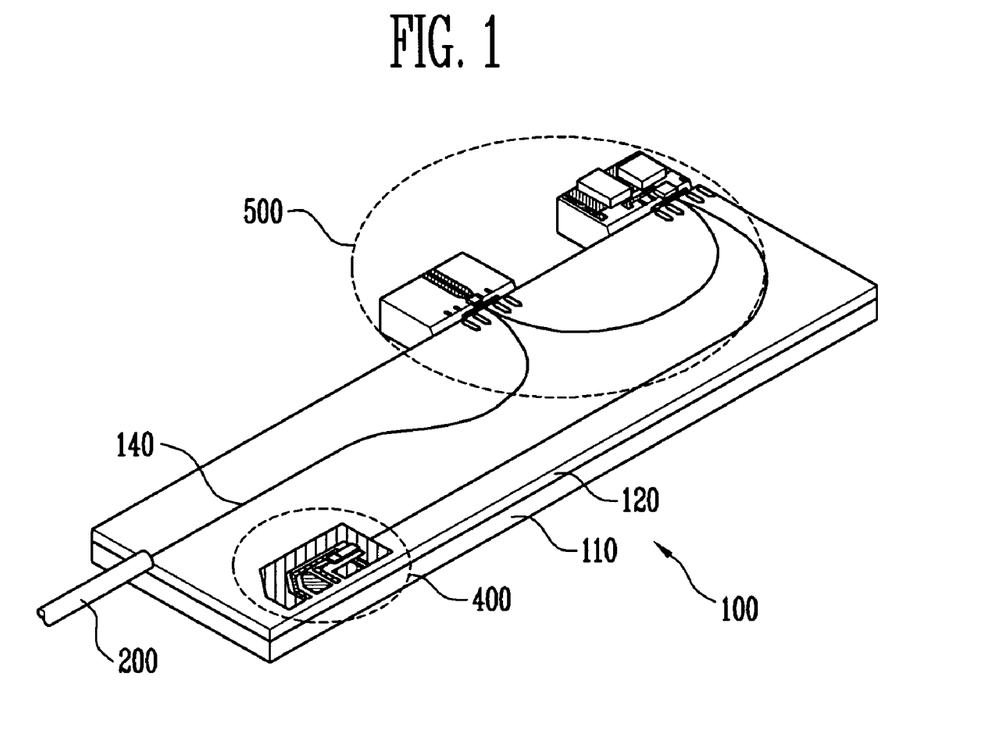
FIG. 1 is a perspective view of a multi-wavelength optical transceiver module according to a first embodiment of the present invention.
Figure 2:
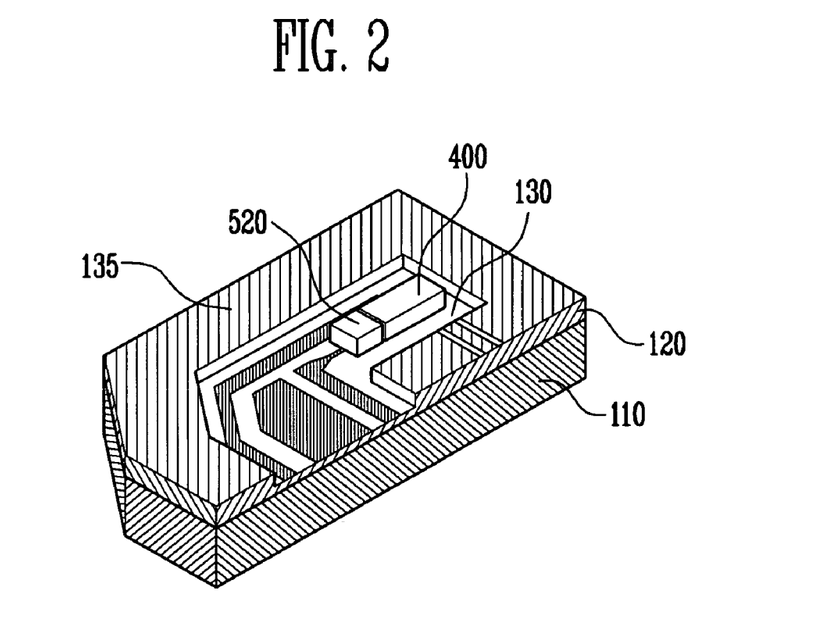
FIG. 2 is an enlarged perspective view of a portion where an optical transmitter is mounted on a PLC platform of FIG. 1.
Figure 3:
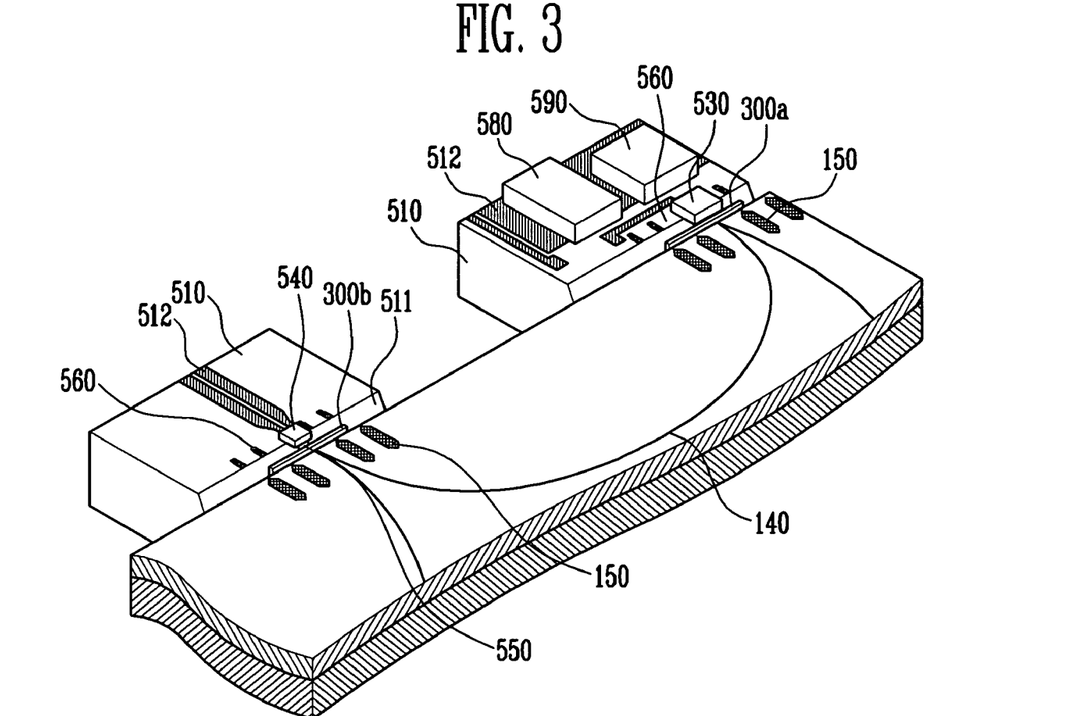
FIG. 3 is an enlarged perspective view of a portion where an optical receiver is coupled to the PLC platform of FIG. 1.
Figure 4:
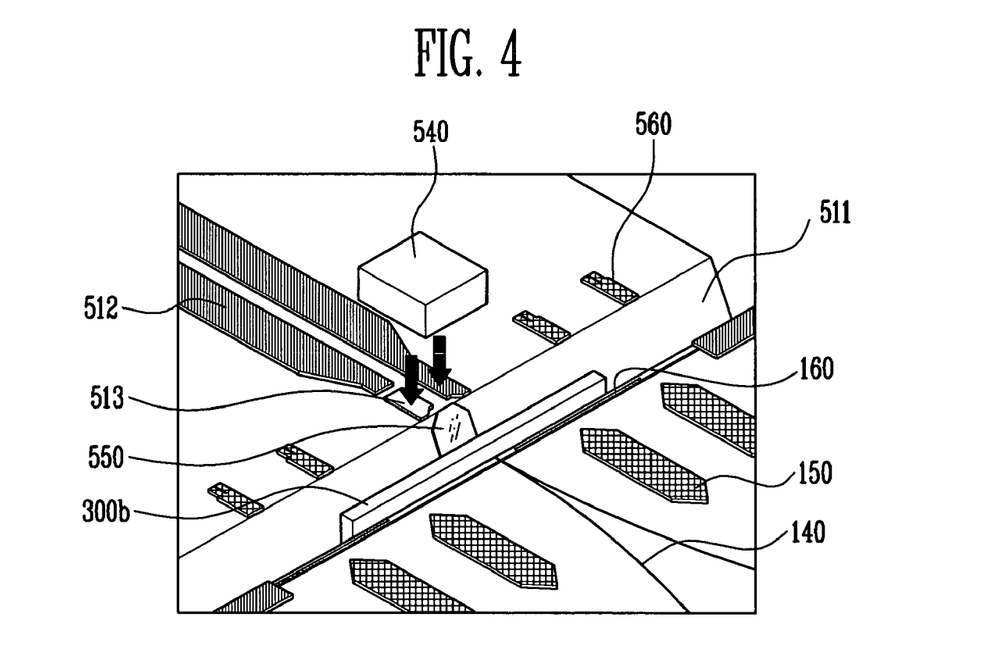
FIG. 4 is an enlarged perspective view of a smaller portion where an optical receiver is coupled to the PLC platform of FIG. 1.
Figure 5:
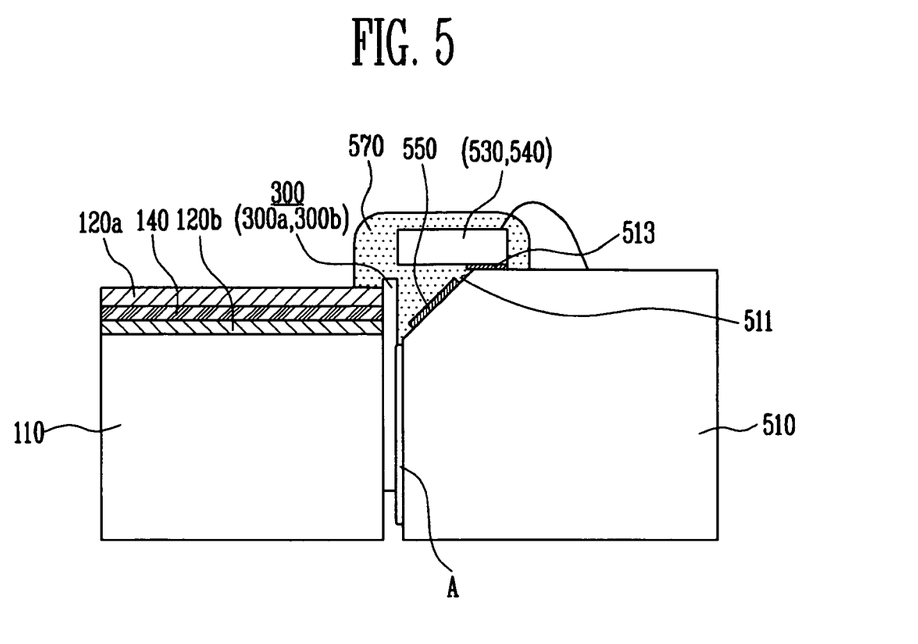
FIG. 5 is a cross sectional view of a portion where an optical receiver is coupled to the PLC platform of FIG. 1.

FIG. 1 is a perspective view of a multi-wavelength optical transceiver module according to a first embodiment of the present invention; FIG. 2 is an enlarged perspective view of a portion where an optical transmitter is mounted on a PLC platform of FIG. 1; FIG. 3 is an enlarged perspective view of a portion where an optical receiver is coupled to the PLC platform of FIG. 1; FIG. 4 is an enlarged perspective view of a smaller portion where an optical receiver is coupled to the PLC platform of FIG. 1; and FIG. 5 is a cross sectional view of a portion where an optical receiver is coupled to the PLC platform of FIG. 1.

Referring to FIGS. 1 through 5, one example of the multi-wavelength optical transceiver module according to a first embodiment of the present invention is an optical triplexer transceiver module, including a PLC platform 100, an optical fiber 200, a thin film filter 300, an optical transmitter 400 and an optical receiver 500.

Here, the PLC platform 100 includes a predetermined silicon substrate 110 and a cladding unit 120 formed on an upper surface of the silicon substrate 110, and the cladding unit 120 is formed of upper/lower cladding layers 120a and 120b with a predetermined thickness (ref. FIG. 5).

In addition, a predetermined mounting trench 130 is formed on one upper side of the cladding unit 120 such that the optical transmitter 400 is mounted, and a predetermined optical waveguide unit 140 is formed in the cladding unit 120.

In addition, a plurality of PLC alignment marks 150 are further formed on the cladding unit 120a of the PLC platform 100 to which the thin film filter 300 is coupled, each being separated in a predetermined gap, in a vertical direction to the thin film filter 300 to passively align the optical receiver 500 and the PLC platform 100.

In addition, at least one dicing mark 160 is further formed on the cladding unit 120 of the PLC platform 100 to which the thin film filter 300 is coupled, in a horizontal direction to the thin film filter 300 to finely dice such that reflection and insertion losses are minimized.

The optical waveguide unit 140 is formed in the cladding unit 120 of the PLC platform 100, and a V-shaped single mode optical waveguide is arranged in a row and connected with each other in a curve such that light transmitted from one side of the optical transmitter 400 and the optical fiber 200 is branched and transmitted in at least one direction.

Here, to reduce a radius of curvature and a device size, it is desirable that the predetermined optical waveguide use a single mode waveguide core having a difference of refractive index of 1.5%-Δ and a width and a height of 4.5 μm.

The optical fiber 200 is coupled to the one side of the PLC platform 100 to transmit/receive light, and a light wavelength transmitted and received is preferably 1310 nm, 1490 nm or 1550 nm.

The thin film filter 300 is coupled to another side of the PLC platform 100, serving to separate input light, e.g., 1310/1490/1550 nm wavelengths. In other words, the thin film filter 300 includes a 1490 nm transmissive thin film filter 330a that reflects light with a wavelength of 1310 nm or 1550 nm and transmits light with a wavelength of 1490 nm, and a 1550 nm transmissive thin film filter 300b that reflects light with a wavelength of 1310 nm or 1490 nm and transmits light with a wavelength of 1550 nm.

The optical transmitter 400 is mounted on a mounting trench 130 formed in the PLC platform 100, and is preferably implemented with a laser diode, e.g., SCLD, which is a light emitting device that outputs light having a wavelength of about 1310 nm. In addition, a first photodiode 520, e.g., a monitoring photodiode is mounted on the PLC platform 100 of the other side of the optical transmitter 400, i.e., on the mounting trench 130 such that light output from the other side of the optical transmitter 400 may be transmitted.

The optical receiver 500 is coupled on one side of the thin film filter 300 and the PLC platform 100 so that light input from the optical fiber 200, respectively, may be received through the optical waveguide unit 140.

In other words, the optical receiver 500 includes a PD carrier 510 attached to one side of the thin film filter 300 to form the overall body, and second and third photodiodes, i.e., 1490/1550 nm receiving photodiodes 530 and 540 mounted on the upper side of the PD carrier 510 such that light transmitting the thin film filter 300 may be received.

Here, an upper edge portion of the PD carrier 510 attached to the thin film filter 300 is formed in a sloped surface 511 tilted at 45 degrees, and a predetermined mirror 550 coated with, for example, Au is included on the sloped surface 511 to reflect the input light.

In addition, the second and third photodiodes 530 and 540 are preferably mounted on the upper side of the PD carrier 510 such that they can receive light reflected by the mirror 550.

In addition, on the upper side of the PD carrier 510 attached to the thin film filter 300, a plurality of PD carrier alignment marks 560 may be further formed, each being separated by a predetermined gap, for a passive alignment in a horizontal direction to the PLC platform 100.

In addition, a index-matching transparent gel 570 may be further formed around the second and third photodiodes 530 and 540 to increase sensitivity of the optical receiver 500.

In addition, a preamplifier 580 may be further included on the PD carrier 510 to be located around the optical receiver 500 to increase receiving sensitivity of the optical receiver 500.

In addition, a chip capacitor 590 may be further included, mounted on one side of the PD carrier 510 for removing a power supply noise upon supplying a reverse voltage to the second and third photodiodes 530 and 540.

Further, while the PD carrier 510 adapted to the first embodiment of the present invention is separated into two, each being attached to one side of the thin film filter 300, the present invention however is not limited thereto, and thus the PD carrier 510 may be attached to the thin film filter 300 in a body.

An operational principle and a manufacturing method of an optical triplexer transceiver module according to the first embodiment of the present invention having the above-mentioned arrangement will now be described in detail.

Referring to FIGS. 1 through 5, with respect to the operational principle of the optical triplexer transceiver module according to the first embodiment of the present invention, light of 1310 nm output from the optical transmitter 400 is transmitted through the optical waveguide unit 140, and reflected at the 1490 nm transmissive thin film filter 300a and the 1550 nm transmissive thin film filter 300b.

In addition, 1550 nm light input from the optical fiber 200 transmits the 1550 nm transmissive thin film filter 300b and is received by the PD carrier 510 to which the third photodiode 540 is attached. 1490 nm light input from the optical fiber 200 is reflected by the 1550 nm transmissive thin film filter 300b and transmits the 1490 nm transmissive thin film filter 300a so that it is received using the PD carrier 510 to which the second photodiode 530 is attached.

A method of manufacturing the optical triplexer transceiver module according to the first embodiment of the present invention will now be described with reference to FIGS. 1 through 5. First, upper/lower cladding layers 120a and 120b having the optical waveguide unit 140 formed therein are formed on the upper surface of the silicon substrate 110 in a predetermined thickness, and then, a predetermined mounting trench 130 is formed in the upper/lower cladding layers 120a and 120b through, for example, a dry etching process.

It is desirable that the optical waveguide unit 140 uses a single mode optical waveguide core having a refractive index difference of 1.5%-Δ and a width of 4.5 μm and a height of 4.5 μm.

Further, the optical waveguide unit 140 allows light transmitting the thin film filter 300 to be directly received with the second and third photodiodes 530 and 540 to thus improve sensitivity of the optical receiver 500. This is because a transmission loss is small when the thin film filter 300 is mounted on the PLC platform 100. In addition, the optical waveguide unit 140 is arranged such that it can attach two 1490/1550 nm transmissive thin film filters 300a and 300b in one dicing.

Further, a Cr/Ni/Au electrode 135 and a solder (not shown) are deposited on a bottom surface of the mounting groove 130 through E-beam evaporation deposition or thermal evaporation deposition, and then, the PLC platform 100 is manufactured through, for example, a lift-off process.

At this time, upon forming the Cr/Ni/Au electrode 135, the PLC alignment marks 150 for passively aligning the PLC platform 100 and the PD carrier 510 are formed, and the solder may be made of various materials such as Au—Sn, Pb—Sn and Pb—In. In particular, with a typical Pb—Sn solder jetting method, a large amount of Au is not required due to the E-beam deposition, which is advantageous in manufacturing a low cost optical module.

Next, after dicing the manufactured PLC platform 100, the optical transmitter 400, e.g., the SCLD and the first photodiode 520 are flip-chip bonded and coupled to the active device mounting trench 130 such that a coupling loss between the optical waveguide unit 140 and the optical transmitter 400 formed on the PLC platform 100 is minimized.

In addition, at the PLC platform 100, the optical waveguide unit 140, i.e., a V-shaped optical waveguide attaches the thin film filter 300, i.e., the 1490 nm transmissive thin film filter 300a and the 1550 nm transmissive thin film filter 300b at the side of an edge in a row using a index-matching epoxy.

The method of attaching the 1490 nm transmissive thin film filter 300a and the 1550 nm transmissive thin film filter 300b to the PLC platform 100 as described above has an advantage in terms of reflection and insertion because the thin film filter can be readily and reproducibly attached without a tilt phenomenon generated due to a difference of a thickness of the thin film filter and a width of the trench in a method of inserting the thin film filter after forming a trench in the PLC platform of the prior art.

Further, upon attaching the 1490 nm transmissive thin film filter 300a and the 1550 nm transmissive thin film filter 300b, the edge of the PLC platform 100 should be finely diced with reference to the dicing mark 160 formed on the PLC platform 100 to minimize the reflection and insertion loss.

The 1490 nm transmissive thin film filter 300a preferably reflects a 1550 nm wavelength as well, so as not to allow 1550 nm partially reflected at the 1550 nm transmissive thin film filter 300b to transmit the 1490 nm transmissive thin film filter 300a to be incident on the second photodiode 530, i.e., the 1490 nm receiving photodiode.

Referring to FIG. 5, a chemical mechanical polishing (CMP) process is performed on, for example, a quartz substrate so that a center of an optical waveguide core formed on the PLC platform 100 is matched to a center of a sloped surface 511 of the PD carrier 510 to align height in a vertical direction.

A sloped surface 511 is formed at 45 degrees with a V-shaped groove to a thickness of about 100 to 150 μm and a surface roughness of less than 0.2 μm, using a blade with an algle of 90 degrees on the CMP completed quartz substrate.

Further, for example, Cr/Ni/Au is deposited through E-beam or thermal deposition and patterned through a photolithography process to form PD carrier alignment marks 560 for a passive alignment in a horizontal direction to the electrode 512, the mirror 550 coated with Au, and the PLC platform 100.

Here, surface roughness of the mirror 550 coated with Au is about 0.1 μm, and total-reflects light of incident. In addition, using E-beam or thermal deposition and lift-off processes, a solder 513 is formed on the PD carrier 510, and then, a 45-degree mirror type PD carrier 510 is manufactured by finely dicing a V-shaped groove intermediate portion.

An additional process is not required since the electrode 512 and the solder 513 formed on the PD carrier 510 are formed at the same time during a manufacturing process of the PLC platform 100.

Further, the PD carrier 510 may be made of a material having a low high-frequency loss and dielectric coefficient and a forming property, including, but not limited to, the quartz substrate and a silicon substrate having Alumina, silica or polymer deposited thereon. In particular, the PD carrier 510 and the PLC platform 100 may be simultaneously processed on the same substrate and respectively diced, in which the center of the single mode optical waveguide and the center of the 45-degree mirror 550 coated with Au can be automatically matched without the CMP process.

Referring to FIGS. 3 and 4, the 1490 nm receiving second photodiode 530 and the 1550 nm receiving third photodiode 540 having about 80 μm of a light-detecting area diameter are die-bonded to the manufactured two PD carriers 510, with the light-detecting surfaces face down, respectively, and the anode electrode of the second and third photodiodes 530 and 540 in contact with the solder 513 formed in the PD carrier 510.

In particular, the preamplifier 580 for amplifying a low photocurrent that flows through the second photodiode 530 and the chip capacitor 590 for removing the power supply noise upon supplying the reverse voltage to the second photodiode 530 are die bonded around the PD carrier 510 to which the second photodiode 530 is attached.

Subsequently, the PD carrier 510 to which the second and third photodiodes 530 and 540 are attached and the PLC platform 100 are passively aligned and attached using the index-matching epoxy (A), in which alignment is made in a horizontal direction and a height direction is automatically matched using the PD carrier alignment mark 560 formed on the PD carrier 510 and the PLC alignment mark 150 formed on the PLC platform 100.

With the above-mentioned method, the PD carrier 510 can be attached to the PLC platform 100 because a light-detecting portion of the commercialized pin-PD has a large diameter as much as about 80 μm and a horizontal/vertical alignment tolerance of about 20 μm is provided.

In addition, as shown in FIG. 5, the second and third photodiodes 530 and 540 are encapsulated with a index-matching transparent gel 570 to increase sensitivity of the optical receiver 500, as shown in FIG. 5.

Furthermore, when two photodiodes, i.e., the second and third photodiodes 530 and 540, are mounted on one PD carrier 510 at the same time rather than two PD carriers 510 and the one PD carrier 510 is mounted on an edge of the PLC platform 100, the PLC platform 100, the 1490/1550 nm transmissive thin film filters 530 and 540 and the PD carrier 510 are co-packaged at the same time, thus reducing the packaging cost.

Lastly, after fusion-splicing a typical single mode fiber (SMF) and a high numerical aperture fiber, the optical triplexer transceiver module is completed by actively aligning and pig-tailing the fusion-spliced high numerical aperture fiber and the single mode waveguide having a difference of a 1.5%-Δ refractive index formed on the PLC platform 100.

Second Embodiment

Figure 6:
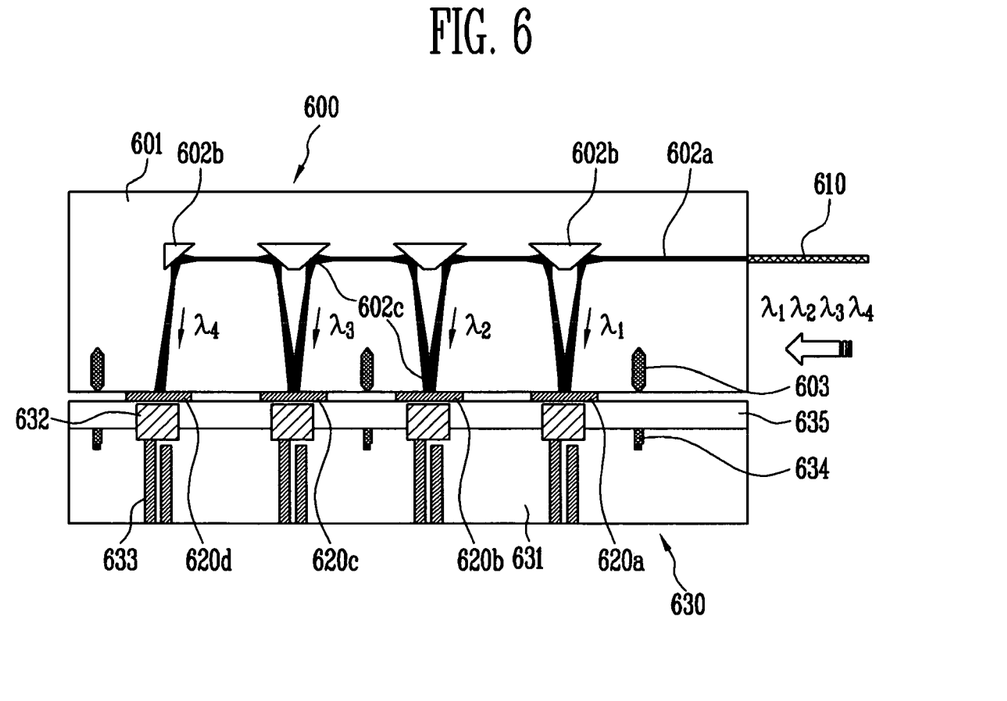
FIG. 6 is a schematic diagram of a multi-wavelength optical receiver module according to a second embodiment of the present invention.

FIG. 6 is a schematic diagram of a multi-wavelength optical receiver module according to a second embodiment of the present invention.

Referring to FIG. 6, a multi-wavelength optical receiver module according to the second embodiment of the present invention, which is one example of the optical quadraplexer receiver module, includes a PLC 600, an optical fiber 610, a thin film filter 620a to 620d, and an optical receiver 630.

Here, the PLC 600 includes a predetermined silicon substrate 601 and a cladding unit 120 (ref. FIGS. 1 and 2) formed on the upper surface of the silicon substrate 601, and predetermined optical waveguide unit 602a to 602c is formed in the cladding unit 120. Further, since the cladding unit 120 is the same element as the cladding unit 120 adapted to the first embodiment of the present invention, refer to the first embodiment for detailed description.

In addition, a plurality of PLC alignment marks 603 are further formed, each being separated in a predetermined gap, on the PLC 600 to which the thin film filters 620a to 620d are attached, in a vertical direction to the thin film filters 620a to 620d to passively align the optical receiver 630 and the PLC 600.

In addition, at least one dicing mark 160 (ref. FIG. 4) is further formed on the PLC 600 to which the thin film filters 620a to 620d are attached, in a horizontal direction to the thin film filters 620a to 620d to finely dice such that reflection and insertion losses are minimized.

The optical waveguide unit 602a to 602c includes a first optical waveguide 602a formed in cladding unit 120 of the PLC 600 in a straight direction; a plurality of total reflection trenches 602b formed on the first optical waveguide 602a, each being separated in a constant gap, for changing a path of light input from the first optical waveguide 602a into a vertical direction; and a plurality of second optical waveguides 602c formed in a vertical direction to the first optical waveguide 602a, and having one end coupled to the first optical waveguide 602a and the total reflection trenches 602b, for reducing a reflection loss of light incident from the total reflection trenches 602b and the thin film filters 620a to 620d.

Here, the first optical waveguide 602a is a single-mode optical waveguide, and one of the plurality of second optical waveguides 602c is a sloped-type optical waveguide formed at the end of the first optical waveguide 602a, and the others are V-shaped optical waveguides arranged in a row from the end of the first optical waveguide 602a.

The optical fiber 610 is coupled to one side of the PLC 600, serving to receive light having a plurality of wavelengths $\lambda_1$ to $\lambda_4$.

It is desirable that the thin film filters 620a to 620d transmit only specific wavelengths $\lambda_1$ to $\lambda_4$ and reflect all the other wavelengths.

The optical receiver 630 is coupled to one side of the thin film filters 620a to 620d, for receiving light having specific wavelengths $\lambda_1$ to $\lambda_4$ that transmit the thin film filters 620a to 620d, however since this is substantially the same element as the optical receiver 500 adapted to the first embodiment of the present invention, refer to the first embodiment for the detailed description thereof.

There are also provided PD carriers 631, a receiving pin-PD 632, an electrode 633, a PD carrier alignment mark 634 and a 45-degree sloped surface 635, which are the same elements as described in the first embodiment of the present invention, and thus refer to the first embodiment for the detailed description thereof.

An operational principle and a manufacturing method of an optical quadraplexer receiver module according to the second embodiment of the present invention having the above-mentioned arrangement will now be described in detail.

Referring to FIG. 6, with respect to the operational principle of the optical quadraplexer receiver module according to the second embodiment of the present invention, four multiplexed wavelengths $\lambda_1$ to $\lambda_4$ input from the optical fiber 610 are passed through the first optical waveguide 602a, optical paths of the wavelengths are vertically changed at the total reflection trenches 602b, and only one wavelength of $\lambda_1$ to $\lambda_4$ wavelengths passes the thin film filters 620a to 620d.

In addition, light transmitting the thin film filters 620a to 620d is reflected from the mirror 550 coated with Au (ref. FIGS. 3 to 5), and then incident on the receiving photodiode 632 and light of all the other wavelengths is reflected, thereby serving as an optical quadraplexer receiver module through a wavelength demultiplexing.

A method of manufacturing an optical quadraplexer receiver module according to the second embodiment of the present invention will now be described with reference to FIG. 6. In other words, an essential structure and a manufacturing method are the same as those in the optical triplexer transceiver module according to the first embodiment of the present invention, except for that the total reflection trenches 602b that change the optical paths are further formed and two optical receivers are added without the optical transmitter 400, and thus the detailed description thereof refers to the first embodiment.

Further, the total reflection trenches 602b are provided by forming the first optical waveguide 602a followed by etching up to a lower cladding layer 120b (FIG. 5) using a dry etching process, and uses a total reflection phenomenon if an angle of incidence exceeds a critical angle when light is incident from a medium having a high refractive index to air having a low refractive index.

When the angle of incidence for total reflection is more than 43 degrees in a medium having a refractive index of about 1.444, the optical path can be changed to 90 degrees without a loss so that the size of the PLC 600 can be significantly reduced.

In other words, it is possible to reduce the size of the optical quadraplexer receiver module according to the second embodiment of the present invention to less than 7 mm. Further, when this method is applied to the optical triplexer transceiver module according to the first embodiment of the present invention, the size of module can be significantly reduced, thus advantageously enabling the low-cost mass production.

In addition, to reduce a loss when light incident from the total reflection trenches 602b and the thin film filters 620a to 620d is reflected, a sloped (tapered) or a V-shaped (tapered) second optical waveguide 602c is formed.

Further, the total reflection trenches 602b, the PLC 600 having the second optical waveguide 602c formed thereon in a tapered shape, the thin film filters 620a to 620d having a plurality of transmissive thin film filters formed thereon, and the PD carrier 631 with a receiving photodiode (PD) 632 mounted can be attached at the same time in a passive alignment method using the PLC alignment mark 603 and the PD carrier alignment mark 634, so that the packaging cost can be reduced.

Further, advantages obtained from the optical triplexer transceiver module according to the first embodiment of the present invention are also applied to the optical quadraplexer receiver module according to the second embodiment of the present invention.

Third Embodiment

Figure 7:
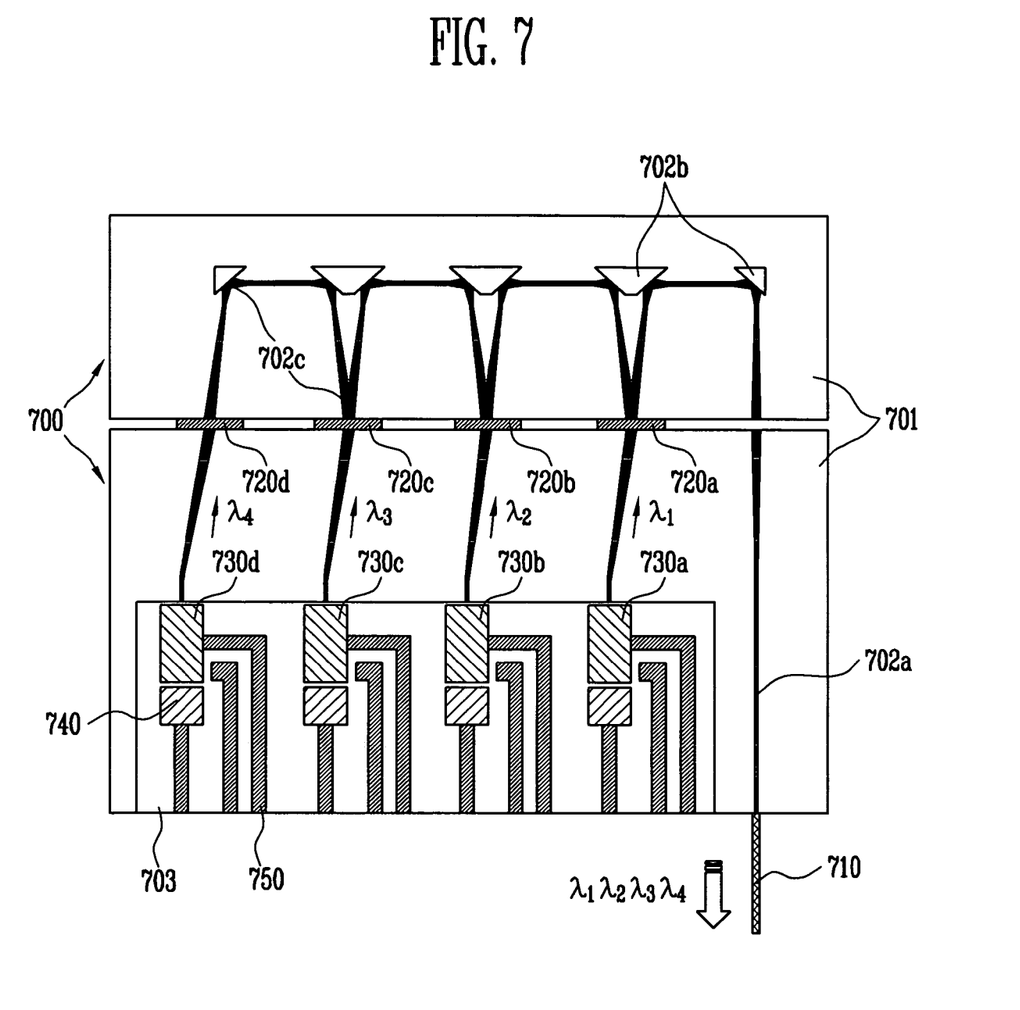
FIG. 7 is a schematic diagram of a multi-wavelength optical transmitter module according to a third embodiment of the present invention.

FIG. 7 is a schematic diagram of a multi-wavelength optical transmitter module according to a third embodiment of the present invention.

Referring to FIG. 7, the multi-wavelength optical transmitter module according to a third embodiment of the present invention, which is one example of the optical quadraplexer transmitter module, includes a PLC platform 700, an optical fiber 710, and thin film filters 720a to 720d.

Here, the PLC platform 700 includes a predetermined silicon substrate 701 and a cladding unit 120 (ref. FIGS. 1 and 2) formed on the silicon substrate 701, a predetermined optical waveguide unit 702a to 702c is formed in the cladding unit 120, and a predetermined mounting trench 703 is formed such that an optical transmitters 730a to 730d are mounted on one side of the cladding unit 120.

Further, since the cladding unit 120 is the same element as the cladding unit 120 adapted to the first embodiment of the present invention, refer to the first embodiment for the detailed description thereof.

The optical waveguide unit 702a to 702c includes a first optical waveguide 702a formed on the PLC platform 700 in a '¬'-shape; a plurality of total reflection trenches 702b formed on the first optical waveguide 702a, each being separated in a constant gap, for changing a path of light input from the first optical waveguide 702a into a vertical direction; and a plurality of second optical waveguides 702c formed in a vertical direction to the first optical waveguide 702a, and having one end coupled to the first optical waveguide 702a and the total reflection trenches 702b, for reducing a reflection loss of light incident from the total reflection trenches 702b and the thin film filters 720a to 720d.

At this time, it is desirable that the first optical waveguide 702a is formed of a single mode optical waveguide, and one of the plurality of second optical waveguides 702b may be a sloped optical waveguide formed at the end of the first optical waveguide 702a and the others may be Y-shaped optical waveguides arranged in a row from the end of the first optical waveguide 702a.

The optical transmitters 730a to 730d are preferably implemented with a laser diode that outputs light of specific wavelengths, e.g., a spot-size converted distributed feedback LD (SC DFB-LD) that emits $\lambda_1$ to $\lambda_4$.

The thin film filters 720a to 720d are preferably implemented with a plurality of transmissive thin film filters that transmit only specific wavelengths $\lambda_1$ to $\lambda_4$ and reflect all the other wavelengths.

Additionally, a monitoring waveguide photodiode (M-WGPD) 740 may be further included that is mounted on the PLC platform 700 at the other side of the optical transmitters 730a to 730d, i.e., a mounting trench 703 such that light output from the other side of the optical transmitters 730a to 730d can be received.

An operational principle and a manufacturing method of an optical quadraplexer transmitter module according to the third embodiment of the present invention having the above-mentioned arrangement will now be described in detail.

Referring to FIG. 7, with respect to the operational principle of the optical quadraplexer transmitter module according to the third embodiment of the present invention, respective wavelengths $\lambda_1$ to $\lambda_4$ output from the optical transmitters 730a to 730d are passed through the second optical waveguide 702c, and through the thin film filters 720a to 720d and the total reflection trenches 702b, and wavelength-multiplexed through the first optical waveguide 702a to the optical fiber 710 to serve as the optical quadraplexer transmitter module. Further, the thin film filters 720a to 720d transmit only specific wavelengths and reflect all the other wavelengths.

The method of manufacturing the optical quadraplexer transmitter module according to the third embodiment of the present invention will now be described with reference to FIG. 7. First, after the optical waveguide unit 702a to 702c is formed on the silicon substrate 701, an active device mounting trench 703 for mounting the optical transmitters 730a to 730d and the monitoring photodiode 740 is formed.

Upon forming the mounting trench 703, the total reflection trenches 702b are formed at the same time, and an electrode 750 and a solder (not shown) is formed on the mounting trench 703 using E-beam deposition and a lift-off process.

Next, a Y-branched portion of the second optical waveguide 702c formed on the PLC platform 700 is finely diced, and the optical transmitters 730a to 730d and the monitoring photodiode 740 are precisely flip-chip bonded to the PLC platform 700 on which the mounting trench 703 is formed.

Next, the PLC platform 700 having the total reflection trenches 702b formed thereon, and the PLC platform 700 having the thin film filters 720a to 720d and the active device, i.e., the optical transmitters 730a and 730d and the monitoring photodiode 740 mounted thereon are attached at the same time, wherein the PLC platforms are actively aligned together with the optical fiber 710 while one of the optical transmitters 730a to 730d is operating and pig-tailed with the optical fiber 710.

In other words, attaching the thin film filters 720a to 720d, and chip-bonding and pig-tailing the PLC platform 700 are simultaneously performed to manufacture a small-sized optical quadraplexer transmitter module.

Fourth Embodiment

Figure 8:
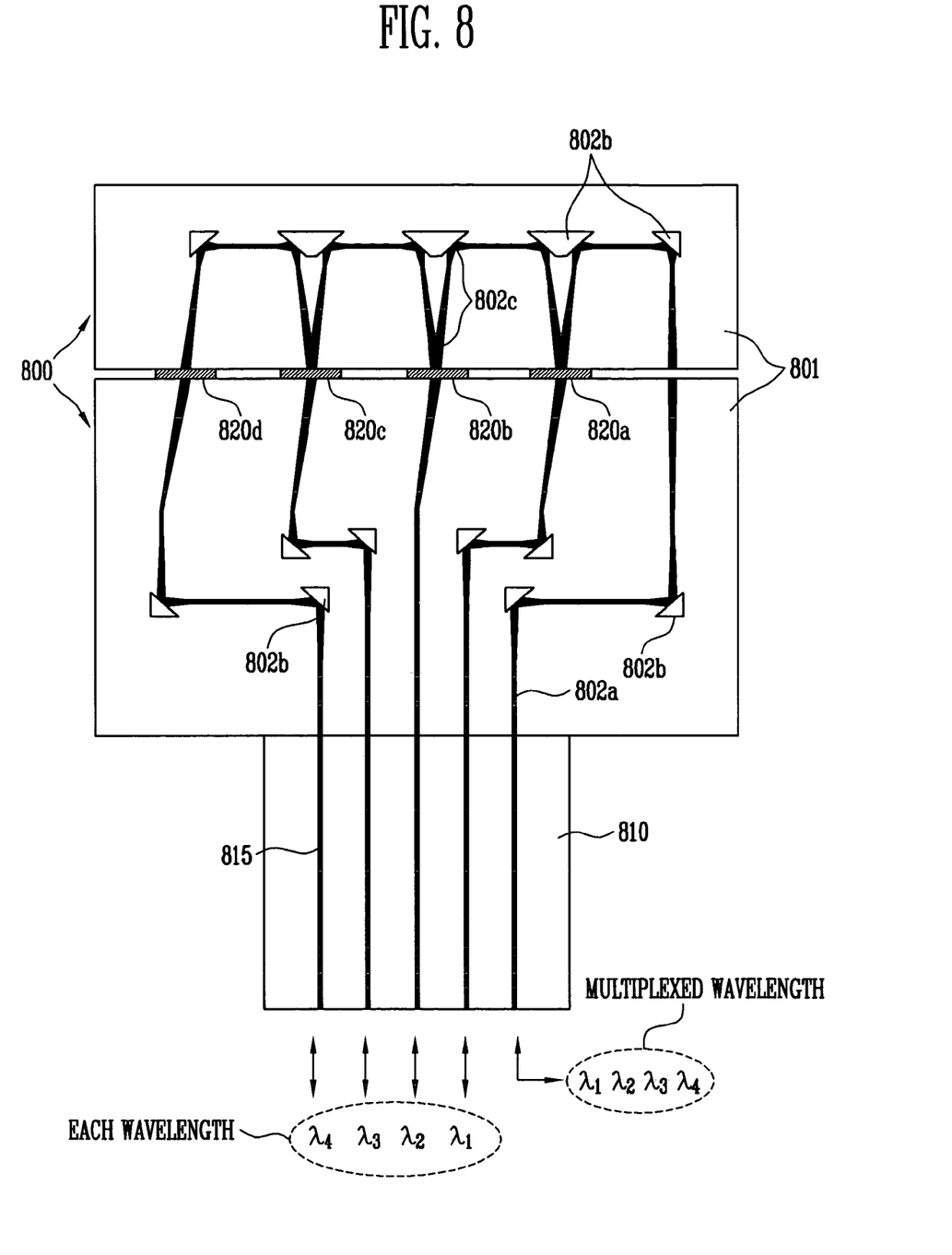
FIG. 8 is a schematic diagram of a multi-wavelength multiplexer/demultiplexer according to a fourth embodiment of the present invention.

FIG. 8 is a schematic diagram of a multi-wavelength multiplexer/demultiplexer according to a fourth embodiment of the present invention.

Referring to FIG. 8, a multi-wavelength multiplexer/demultiplexer according to a fourth embodiment of the present invention, which is one example quadraplexer multiplexer/demultiplexer, includes a PLC 800, an optical fiber block 810, and thin film filters 820a to 820d.

Here, the PLC 800 includes a predetermined silicon substrate 801 and a cladding unit 120 (ref. FIGS. 1 and 2) formed on an upper surface of the silicon substrate 801, and a predetermined optical waveguide unit 802a to 802c is formed in the cladding unit 120. Further, since the cladding unit 120 is the same element as the cladding unit 120 adapted to the first embodiment of the present invention, refer to the first embodiment for the detailed description thereof.

The optical waveguide unit 802a to 802c includes a first optical waveguide 802a formed on the PLC 800 in a bent shape in at least one vertical direction; a plurality of total reflection trenches 802b formed on a bent portion and other portions of the first optical waveguide 802a, each being separated in a constant gap, for changing a path of light input from the first optical waveguide 802a into a vertical direction; and a plurality of second optical waveguides 802c formed in a vertical direction to the first optical waveguide 802a, and having one end coupled to the first optical waveguide 802a and the total reflection trenches 802b, for reducing a reflection loss of light incident from the total reflection trenches 802b and the thin film filters 820a to 820d.

At this time, it is desirable that the first optical waveguide 802a is a single mode optical waveguide, and two of the plurality of second optical waveguides 802c may be sloped optical waveguides formed at both ends of the first optical waveguide 802a and the others may be Y-shaped optical waveguides arranged in a row from both ends of the first optical waveguide 802a.

The optical fiber block 810 is coupled to one side of the PLC 800, and a predetermined optical fiber 815 is fixed therein, serving to transmit light having a plurality of wavelengths $\lambda_1$ to $\lambda_4$.

It is desirable that the thin film filters 820a to 820d include a plurality of transmissive thin film filters that transmit only specific wavelengths $\lambda_1$ to $\lambda_4$ and reflect all the other wavelengths.

While the quadraplexer multiplexer/demultiplexer according to the fourth embodiment of the present invention is substantially the same arrangement as the optical quadraplexer transmitter module according to the third embodiment of the present invention, it is a passive device that enables wavelength multiplexing/demultiplexing such that the active devices, i.e., the optical transmitters 730a to 730d and the monitoring photodiode 740 are replaced with the optical fiber block 810 and a part of the total reflection trenches 802b for matching a pitch with each fiber 815 embeded in the optical fiber block 810 are added.

A method of manufacturing a quadraplexer multiplexer/demultiplexer according to the fourth embodiment of the present invention will now be described with reference to FIG. 8. First, after the first and second optical waveguide units 802a and 802c are formed on the silicon substrate 801, the PLC 800 is formed by dry etching up to the lower cladding layer 120b (FIG. 5) to form the total reflection trenches 802b.

Next, a Y-branched portion of the second optical waveguide 802c formed on the PLC 800 is finely diced, and the thin film filters 820a to 820d that transmit any specific wavelengths $\lambda_1$ to $\lambda_4$, two PLCs 800 having the total reflection trenches 802b formed thereon, and a 5-channel optical fiber block 810 are actively aligned and co-packaged to manufacture the quadraplexer multiplexer/demultiplexer.

A structure of a quadraplexer multiplexer/demultiplexer as described above is advantageous in terms of the low cost by using one optical fiber block 810, which is connected to input/output optical waveguides 802a formed in one direction. In addition, the low-cost optical module can be implemented because a device size can be significantly reduced and mass production is available by changing an optical path in a vertical direction with the total reflection trenches 802b rather than a bent waveguide.

Further, Referring to FIGS. 6 through 8, The optical waveguide portion connected with total reflection trenches 602b, 702b and 802b, The optical waveguide portion contacted with the thin film filters 620a to 620d, 720a to 720d and 820a to 820d, and The optical waveguide portion connected with the PLS platforms 700 and the PLCs 800 are composed of a taper-type optical waveguide.

As described above, according to a multi-wavelength optical transceiver module, and a multiplexer/demultiplexer using a thin film filter of the present invention, a thin film filter, an optical transmitter, an optical receiver, and an optical fiber are hybrid-integrated on a PLC platform, thereby enabling mass production with the low cost.

In addition, according to the present invention, sensitivity of the optical receiver can be improved such that light transmitting the thin film filter is directly received by a photodiode. Further, a method of attaching two thin film filters to the PLC platform with one dicing has an advantage in terms of reflection and insertion because the thin film filter can be readily and reproducibly attached without a tilt phenomenon generated due to a difference of a thickness of the thin film filter and a width of the trench in a conventional method of inserting the thin film filter after forming a trench in the PLC platform of the prior art.

In addition, according to the present invention, with two photodiodes simultaneously mounted on one PD carrier, two thin film filters and the PLC platform can be passively aligned and co-packaged at the same time, thereby advantageously reducing the manufacturing cost of an optical module.

In addition, according to the present invention, when the PD carrier and the PLC platform are simultaneously processed on the same substrate, a center of a single mode optical waveguide core and a center of 45-degree mirror coated with Au can be automatically matched without a CMP process.

In addition, according to the present invention, by manufacturing a PD carrier using a glass-type quartz different from the PLC platform, light and an electromagnetic wave can be confined to the PLC platform, so that it is advantageous in terms of light and electrical crosstalk suppression.

In addition, according to the present invention, an air gap is provided between the PD carriers using two PD carriers rather than one PD carrier, thereby suppressing light and electrical crosstalk.

In addition, according to the present invention, by using a commercialized photodiode, e.g., pin-PD, having good responsivity and IMD characteristics rather than a waveguide-type photodiode (PD), a supply and demand of materials like the photodiodes is managed well and a performance of an optical module can be readily implemented.

In addition, according to the present invention, a PLC having a total reflection trench and a tapered optical waveguide formed thereon and a PD carrier having four transmissive thin film filters and pin-PD mounted thereon can be passively aligned and co-packaged using a PLC alignment mark and a PD carrier alignment mark, thereby reducing the packaging cost.

In addition, according to the present invention, a size of an optical quadraplexer transmitter and receiver module can be reduced using a total reflection trench, so that it is advantageous in terms of the low cost. Further, using the total reflection trenches in the optical triplexer transceiver module, a size of an optical module can be reduced.

In addition, according to the present invention, a total reflection trenches, a PLC having a tapered optical waveguide formed thereon, four transmissive thin film filters, a PLC platform having an optical transmitter (SC DFB-LD) and an optical receiver (monitoring WGPD) mounted thereon, and an optical fiber can be actively aligned and co-packaged.

In addition, according to the present invention, a quadraplexer multiplexer/demultiplexer has the same merits as in the optical quadraplexer transmitter module, however using a 5-channel optical fiber block rather than the PLC platform having the optical transmitter (SC DFB-LD) and the optical receiver (monitoring WGPD), only a fiber block is needed instead of using two fiber blocks because input/output ports are formed at the same region, thereby advantageously reducing the packaging material cost.

In addition, the present invention improves a yield for each component used when manufacturing an optical module, and provides a structure of readily attaching the thin film filter to the edge of the PLC platform and of enhancing sensitivity of the optical triplexer transceiver module.

Exemplary embodiments of a multi-wavelength optical transceiver module, and a multiplexer/demultiplexer using a thin film filter according to the present invention have been described in detail, however, the present invention is not limited thereto. Those skilled in the art will appreciate that a variety of modifications can be made to the described embodiments without departing from the spirit and scope of the present invention as defined by the appended claims and their equivalents.

What is claimed is:

1. A multi-wavelength optical transceiver module using a thin film filter, comprising:
    a PLC platform on which a predetermined optical waveguide unit is formed and an optical transmitter is mounted;
    an optical fiber coupled to one side of the PLC platform to transmit a predetermined light;
    a plurality of thin film filters coupled to another side of the PLC platform to separate input optical wavelengths; and
    an optical receiver coupled to one side of each of the thin film filters to receive light that is input from the optical fiber and transmits the thin film filters, wherein the optical receiver comprises:
        a PD carrier attached to one side of the thin film filters to form an overall body; and
        first and second photodiodes mounted on an upper surface of the PD carrier to receive light that transmits the thin film filters.

2. The multi-wavelength optical transceiver module according to claim 1, wherein the optical waveguide unit has V-shaped optical waveguides arranged in a row and connected to each other in a curve such that light transmitted from one side of the optical transmitter and the optical fiber is branched and transmitted in at least one direction.

3. The multi-wavelength optical transceiver module according to claim 1, wherein the PLC plafform comprises a substrate and a cladding unit formed on an upper surface of the substrate,
    wherein a predetermined mounting trench is formed such that the optical tranarnifter is mounted on one side of the cladding unit, and
    wherein the optical waveguide unit is formed in the cladding unit.

4. The multi-wavelength optical transceiver module according to claim 1, further comprising a plurality of PLC alignment marks formed on the PLC platform, and separated by a predetermined gap in a vertical direction to the thin film filters to passively align the optical receiver and the PLC platform.

5. The multi-wavelength optical transceiver module according to claim 1, further comprising at least one dicing mark formed on the PLC platform in a horizontal direction to the thin film filters to finely dice such that reflection and insertion losses are minimized.

6. The multi-wavelength optical transceiver module according to claim 1, further comprising a monitoring photodiode mounted on the PLC platform at another side of the optical transmitter to receive light output from the other side of the optical transmitter.

7. The multi-wavelength optical transceiver module according to claim 1, wherein the thin film filters comprise:
a 1490 nm transmissive thin film filter for reflecting light with a wavelength of 1310 nm or 1550 nm and transmitting light with a wavelength of 1490 nm; and
a 1550 nm transmissive thin film filter for reflecting light with a wavelength of 1310 nm or 1490 nm and transmitting light with a wavelength of 1550 nm.

8. The multi-wavelength optical transceiver module according to claim 1,
wherein an upper edge of the PD carrier attached to the thin film filter is formed in a sloped surface tilted at 45 degrees,
wherein the PD carrier has a predetermined mirror that reflects light incident on the sloped surface, and
wherein the first and second photodiodes are mounted on the upper surface of the PD carrier to receive light reflected by the mirror.

9. The multi-wavelength optical transceiver module according to claim 1, further comprising a plurality of PD carrier alignment marks formed on the upper surface of the PD carrier attached to the thin film filter and separated from each other by a predetermined gap to passively align in a horizontal direction to the PLC platform.

10. The multi-wavelength optical transceiver module according to claim 1, further comprising a transparent gel arranged around the first and second photodiodes and having a refractive index matched to increase sensitivity of the optical receiver.

11. The multi-wavelength optical transceiver module according to claim 1, further comprising a preamplifier arranged on the upper surface of the PD carrier to be located around the opticar receiver to increase sensitivity of the optical receiver.

12. The multi-wavelength optical transceiver module according to claim 1, further comprising a chip capacitor mounted on one side of the PD carrier to remove a power supply noise upon supplying a reverse voltage to the first and second photodiodes.

13. A multi-wavelength optical receiver module using a thin film filter comprising:
a PLC having a predetermined optical waveguide unit formed thereon;
an optical fiber coupled to one side of the PLC to transmit a predetermined light;
a plurality of thin film filters coupled to another side of the PLC to separate input light wavelengths; and
an optical receiver coupled to one side of the thin film filters to receive light that transmits the thin film filters, wherein the optical receiver comprises:
a PD carrier coupled to one side of the thin film filter to form an overall body; and
a plurality of photodiodes mounted on an upper surface of the PD carrier to receive light that transmits the thin film filters.

14. The multi-wavelength optical receiver module according to claim 13, wherein the optical waveguide unit comprises:
a first optical waveguide formed on the PLC in a straight direction;
a plurality of total reflection trenches formed on the first optical waveguide, each total reflection trench being separated from each other by a constant gap for changing a path of light input from the first optical waveguide into a vertical direction; and
a plurality of second optical waveguides formed in a vertical direction to the first optical waveguide, and having one end coupled to the first optical waveguide and the total reflection trenches for reducing a reflection loss of light incident from the total reflection trenches and the thin film filters.

15. The multi-wavelength optical receiver module according to claim 14,
wherein the first optical waveguide is a single-mode optical waveguide, and
wherein one of the plurality of second optical waveguides is a sloped-type optical waveguide formed at an end of the first optical waveguide, and the others are V-shaped optical waveguides arranged in a row from an end of the first optical waveguide.

16. The multi-wavelength optical receiver module according to claim 13, wherein the PLC comprises a cladding unit formed on a substrate and an upper surface of the substrate, the cladding unit having the optical waveguide unit formed therein.

17. The multi-wavelength optical receiver module according to claim 13, wherein the thin film filters transmit only a specific wavelength, and reflect the remaining wavelengths.

18. The multi-wavelength optical receiver module according to claim 13,
wherein an upper edge of a PD carrier attached to the thin film filter is formed in a sloped surface tilted at 45 degrees,
wherein the PD carrier has a predetermined mirror that reflects light incident on the sloped surface, and
wherein photodiodes are mounted on the upper surface of the PD carrier to receive light reflected by the mirror.

19. A multi-wavelength optical transmitter module comprising,
a PLC platform, on which a predetermined optical waveguide unit is formed and a plurality of optical transmitters are mounted;
an optical fiber coupled to one side of the PLC platform to transmit a predetermined light;
a plurality of thin film filters coupled to another side of the PLC platform to separate input optical wavelengths; and
a monitoring photodiode mounted on the PLC platform at the other side of the optical transmitters for receiving light output from the other side of the optical transmitters.

20. The multi-wavelength optical transmitter module according to claim 19, wherein the optical waveguide unit comprises:
a first optical waveguide formed on the PLC platform in a '¬'-shape;
a plurality of total reflection trenches formed on the first optical waveguide, each total reflection trench being separated from each other by a constant gap for changing a path of light input from the first optical waveguide into a perpendicular direction; and
a plurality of second optical waveguides formed in a vertical direction to the first optical waveguide and having one end coupled to the first optical waveguide and the total reflection trenches to reduce a reflection loss of light incident from the total reflection trenches and the thin film filters.

21. The multi-wavelength optical transmitter module according to claim 20,
wherein the first optical waveguide is a single mode optical waveguide, and
wherein one of the plurality of second optical waveguides is a sloped-type optical waveguide formed at an end of the first optical waveguide and the others are Y-shaped optical waveguides arranged in a row from the end of the first waveguide.

22. The multi-wavelength optical transmitter module according to claim 19,
wherein the PLC platform comprises a substrate and a cladding unit formed on an upper surface of the substrate,
wherein a predetermined mounting trench is formed at the one side of the cladding unit such that the optical transmitters are mounted, and
wherein the optical waveguide unit is formed in the cladding unit.

23. The multi-wavelength optical transmitter module according to claim 19, wherein the optical filters are composed of a plurality of transmissive thin film filters that transmit only a specific wavelength and reflect the remaining wavelengths.

24. A multi-wavelength multiplexer/demultiplexer using a thin film filter, comprising:
a PLC having a predetermined optical waveguide unit formed thereon, the optical wavecuide unit comprising:
a first optical waveguide formed on the PLC in the bent shape in at least one perpendicular direction;
a plurality of total reflection trenches formed on a bent portion and other portions of the first optical waveguide, each total reflection trench being separated from each other by a constant gap for changing a path of light input from the first optical waveguide into a perpendicular direction; and
a plurality of second optical waveguides formed in a perpendicular direction to the first optical waveguide and having one end coupled to the first optical waveguide and the total reflection trenches to reduce a reflection loss of light incident from the total reflection trenches and the thin film filters;
an optical fiber block coupled to one side of the PLC to transmit light with a predetermined optical fiber fixed; and
a plurality of thin film filters coupled to another side of the PLC to separate input light wavelengths.

25. The multi-wavelength multiplexer/demultiplexer according to claim 24,
wherein the first optical waveguide is a single mode optical waveguide, and
wherein two of the plurality of second optical waveguides are sloped-type optical waveguides formed at both ends of the first optical waveguide, and the others are Y-shaped optical waveguides arranged in a row from both ends of the first waveguide.

26. The multi-wavelength multiplexer/demultiplexer according to claim 24, wherein the PLC comprises a substrate and a cladding unit formed on an upper surface of the substrate, the cladding unit having the optical waveguide unit formed therein.

27. The multi-wavelength multiplexer/demultiplexer according to claim 24, wherein the optical filters comprise a plurality of transmissive thin film filters that transmit only a specific wavelength and reflect the remaining wavelengths.

* * * * *